(12) United States Patent  (10) Patent No.: US 8,773,121 B2
Mao et al.  (45) Date of Patent: Jul. 8, 2014

(54) MAGNETIC INPUT FOR COMPUTER DEVICE

(75) Inventors: Xiaodong Mao, Foster City, CA (US); Noam Rimon, Redwood City, CA (US)

(73) Assignee: Sony Computer Entertainment Inc., Tokyo (JP)

( * ) Notice: Subject to any disclaimer, the term of this patent is extended or adjusted under 35 U.S.C. 154(b) by 591 days.

(21) Appl. No.: 12/792,586

(22) Filed: Jun. 2, 2010

(65) Prior Publication Data

US 2011/0298452 A1 Dec. 8, 2011

(51) Int. Cl.
*G01R 33/06* (2006.01)
*G01R 33/07* (2006.01)

(52) U.S. Cl.
CPC ...................... *G01R 33/07* (2013.01)
USPC .......................................... 324/251

(58) Field of Classification Search
None
See application file for complete search history.

(56) References Cited

U.S. PATENT DOCUMENTS

| 3,701,126 A | * | 10/1972 | Reichard | 365/9 |
| 3,736,578 A | * | 5/1973 | Masuda | 365/170 |
| 5,734,130 A | | 3/1998 | Baker | |
| 2008/0039199 A1 | | 2/2008 | Baer et al. | |

FOREIGN PATENT DOCUMENTS

| JP | 08-016718 | 1/1996 |
| JP | 2006-338526 | 12/2006 |
| JP | 2007-133691 | 5/2007 |
| JP | 2009-056052 | 3/2009 |
| WO | 2009042662 A | 4/2009 |

OTHER PUBLICATIONS

JP 08-016718 English Translation (Jan. 19, 1996).*
Chinese Office Action for CN Patent Application No. 201110147354. 5, dated Mar. 7, 2014.
European Search Report for European Patent Application No. EP11165966.0, dated Jan. 13, 2014, pp. 1-8, European Patent Office, Berlin, Germany.

* cited by examiner

*Primary Examiner* — Paresh Patel
(74) *Attorney, Agent, or Firm* — Joshua D. Isenberg; JDI Patent

(57) ABSTRACT

A magnetic input apparatus and method for a computer device are disclosed. A grid pattern of magnetic sensors can include a plurality of Hall elements. Each Hall element is selectively coupled to a Hall voltage sensor. A source of magnetic field can be placed in proximity to the grid pattern and one or more Hall voltage measurements for one or more of the regions can be collected with the Hall voltage sensor. The measurements can be analyzed to determine a position of the source of the magnetic field with respect to the grid pattern. Input can be provided to the computer program based on the determined position of the source of the magnetic field.

16 Claims, 4 Drawing Sheets

MAGNETIC INPUT FOR COMPUTER DEVICE

CROSS-REFERENCE TO RELATED APPLICATION

This application is related to commonly-assigned, co-pending application Ser. No. 12/792,567, entitled "CAPACITIVE INPUT FOR COMPUTER PROGRAM" filed the same day as the present application, the entire disclosures of which are incorporated herein by reference.

This application is related to commonly-assigned, co-pending application Ser. No. 12/792,628, entitled "INPUT FOR COMPUTER DEVICE USING PATTERN-BASED COMPUTER VISION" filed the same day as the present application, the entire disclosures of which are incorporated herein by reference.

FIELD OF THE INVENTION

Embodiments of the present invention relate generally to computer entertainment devices and more particularly to a Hall Effect interface for a computer entertainment device.

BACKGROUND OF THE INVENTION

Video games have become a very popular form of entertainment. A typical video game utilizes an interface or controller to receive inputs from a user. A common type of controller is a hand-held controller that uses pushbuttons or joysticks to provide inputs. Another type of controller, commonly referred to as a "dance pad" is used with games based on dance. In a typical dance-based game a user is prompted to press selected buttons on the dance pad at specific times in response to some sort of visual indicator displayed on a video screen. In the dance pad, the control buttons are typically integrated into a plastic mat. The user can press different control buttons by stepping or dancing on corresponding areas of the mat.

A dance pad basically acts as a pushbutton controller that is operated with the feet as opposed to the hands. However, the dance pad does not track the proximity a user's feet.

It is within this context that embodiments of the invention arise.

BRIEF DESCRIPTION OF THE DRAWINGS

Embodiments of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Certain embodiments of the present invention can utilize magnetic sensors based on a concept known as the Hall Effect. The Hall Effect may be understood with respect to FIG. 1A and FIG. 1B. When a conductor material 101 carrying an electric current I is placed into a magnetic field B, a voltage will be generated perpendicular to both the electric current I and magnetic field B based on Hall Effect. The voltage is interpreted as resulting from deflection of charge carriers (e.g., electrons) in the conductor material 101 by the magnetic field B. The deflection of the charge carriers is generally in a direction perpendicular to both the magnetic field and the direction of motion of the charge carriers. The voltage that results from the presence of the magnetic field, known as the Hall voltage, is generally proportional to the strength of the magnetic field, the magnitude of the current and a property of the conductive material known as the Hall coefficient. The Hall coefficient is defined as the ratio of the induced electric field to the product of the current density and the applied magnetic field. It is a characteristic of the material from which the conductor 101 is made, as its value depends on the type, number, and properties of the charge carriers that constitute the current. In general, the Hall coefficient is inversely proportional to the number density of charge carriers in the conductor.

Figure 1A:
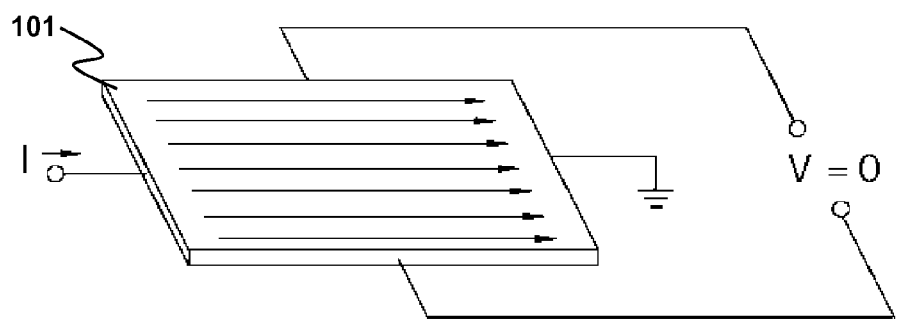
FIGS. 1A-1B a schematic diagrams illustrating the principle of the Hall Effect.
Figure 1B:
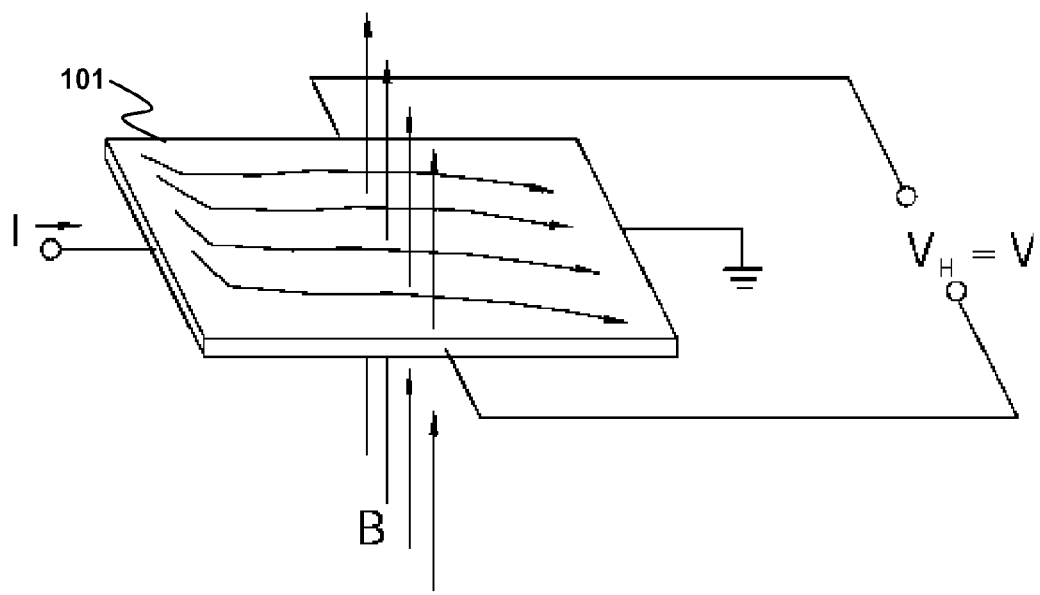

In the absence of the magnetic field B, the Hall voltage V is expected to be zero as illustrated in FIG. 1A, since there is no deflection of the current I. With the magnetic field the current I is deflected and the Hall voltage V may be approximated as $V = C \times (I \times B)$, where C is a coefficient, which can be pre-calibrated. Given a known magnetic field B and current I, the proximity of the conductor 101 to the source of the magnetic field B can alter the value of the magnetic field detected by the Hall-Effect sensor resulting in an altered voltage output. This voltage change can be differentially amplified differentially to provide an output.

Figure 2:
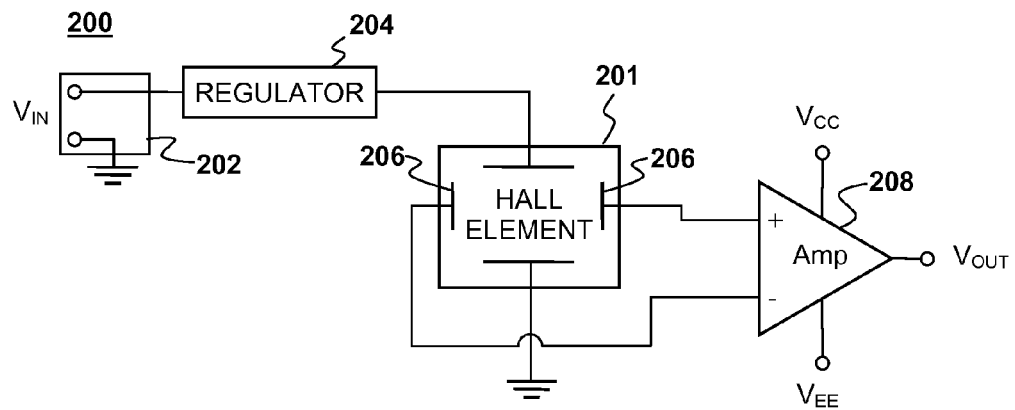
FIG. 2 is a schematic diagram of an example of a Hall Effect measurement circuit.

FIG. 2 illustrates an example of a conventional Hall Effect sensor 200. The Hall Effect sensor 200 generally includes a generally rectangular Hall element 201 made of a Hall Effect material, e.g., a semiconductor characterized by a large Hall coefficient. A voltage from a current source 202 drives a current I through the Hall element 201 in a first direction in proportion to an input voltage $V_{IN}$. A current regulator 204 may be used to control the amount of current I. A pair of electrodes 206 on the Hall element 201 are oriented parallel to the direction of the current. The electrodes 206 are connected a differential amplifier 208, which is driven by power supply voltages $V_{CC}$ and $V_{EE}$. The presence of a magnetic field having a component perpendicular to the plane of the Hall element 201 induces a Hall voltage between the electrodes 206. The differential amplifier 208 amplifies the Hall voltage to provide an output voltage $V_{OUT}$ that is dependent on the strength of the magnetic field.

Embodiments

Figure 3:
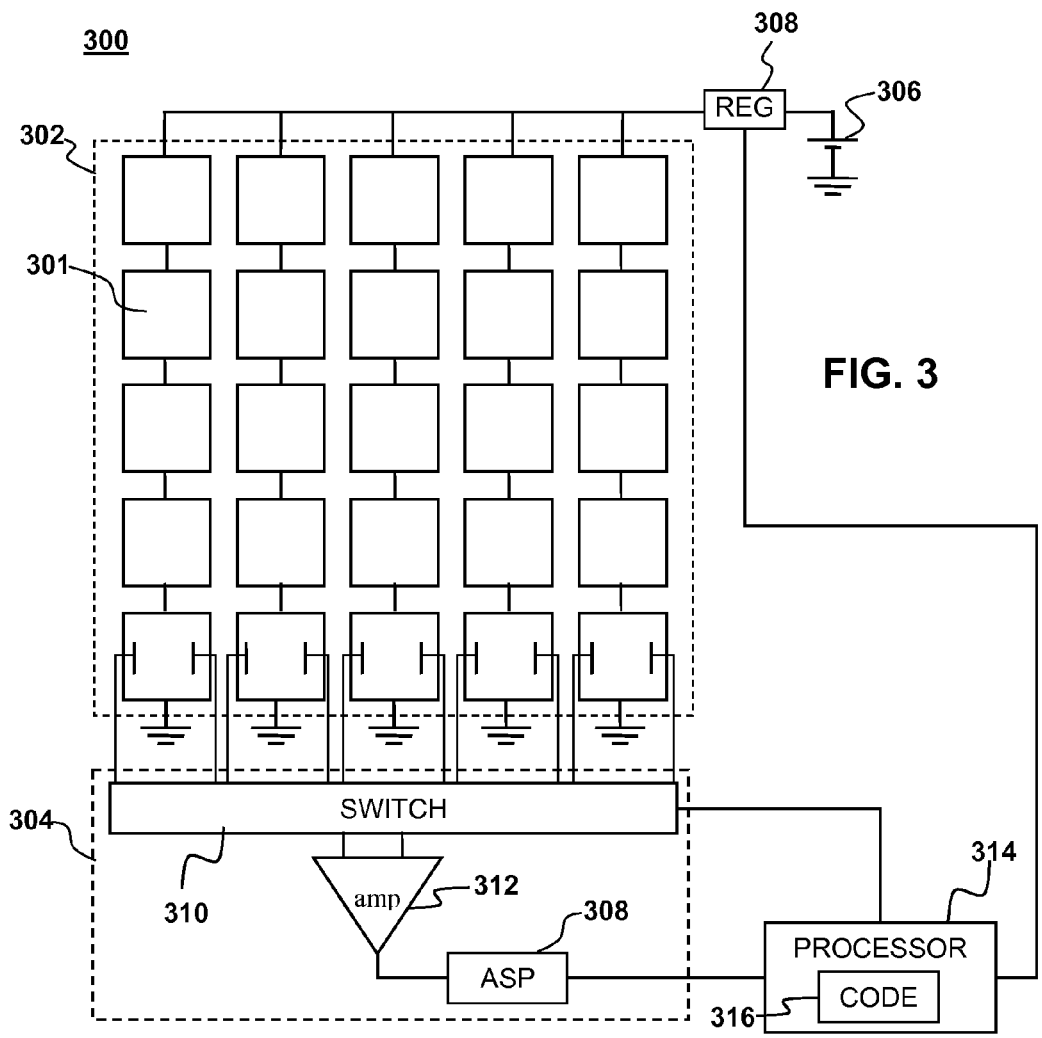
FIG. 3 is a schematic diagram of an example of a Hall Effect input apparatus for a computer system according to an embodiment of the present invention.

According to an embodiment of the present invention the Hall Effect may be used as the basis of a magnetic input apparatus 300 for a computer device, e.g., as illustrated in FIG. 3. The apparatus 300 generally includes a grid pattern 302 having a plurality of magnetic sensors, which can be Hall elements 301. Each Hall element 301 may be configured as described above with respect to Hall element 201. In the example depicted in FIG. 3, the Hall elements are arranged in a rectangular pattern of rows and columns. Embodiments of the invention are not limited to such arrangements, however.

A current source 306 can supply a known electric current to each of the Hall elements. By way of example, and not by way of limitation, the current source 306 provides current in parallel to each different column of Hall elements 301 in the grid pattern 302, e.g., as illustrated in FIG. 3. In this example, the Hall elements in a given column are connected to each other in series and the columns are connected in parallel. A current regulator 308 may be coupled to the current source 306 to regulate the value of the current through the Hall elements.

Each Hall element 301 is selectively coupled to a signal sensor 304. By way of example, and not by way of limitation, each Hall element 301 may be individually coupled to a differential amplifier, e.g., as illustrated in FIG. 2 above. Should such a configuration be cost prohibitive the Hall elements may alternatively each be coupled to a switch 310 that can selectively couple each Hall element to a single amplifier 312.

In a preferred embodiment, the apparatus 300 may include an analog signal processing chip having an input coupled to an output of the differential amplifier 312. The analog signal-processing chip 308 can provide a very high degree of precision in the measurement of the differential amplifier output.

Some embodiments, as alternatives to Hall-effect based sensors, the magnetic sensors in the grid pattern 302 may be implemented as an array of magnetoresistive sensors (MR), giant magnetoresistance (GMR) sensors, and the like. Commercially available examples of such magnetic sensors include HMC series sensors from Honeywell Aerospace Plymouth of Plymouth, Minn.

A computer processor 314 may be coupled to the magnetic sensors in the grid pattern 302, e.g., through a connection to the signal sensor 304. By way of example, and not by way of limitation, the computer processor 314 can be configured, e.g., through a suitable program 316, to obtain Hall effect voltage measurements for one or more of the Hall elements 301 from the signal sensor 304 and analyze the measurements to determine a position of a source of a magnetic field with respect to the grid pattern 302. In some embodiments, the computer processor 314 may be part of a larger computer system such as a computer entertainment apparatus.

By way of example, and not by way of limitation, the source of the magnetic field may be one or more magnets (not shown in FIG. 3). Preferably, the magnets are of sufficient strength to change a Hall voltage signal measured at one of the Hall elements by the corresponding signal sensor 304. A degree of the change of the Hall voltage signal can vary with a degree of proximity of the magnet to the corresponding one of the regions.

In general, the strength of the magnetic field at a given Hall element 301 will decrease with increasing distance from the Hall element. By way of example, and not by way of limitation, the program 316 may be calibrated by placing a known magnet at one or more known position with respect to a Hall element and measuring the resulting Hall voltages. The program 316 may take calibrated variation of field strength with distance into account to determine a distance of the magnet from one or more of the Hall elements 301 at runtime.

By way of example, and not by way of limitation, the program 316 can be configured to determine a distance to the source of the magnetic field from three or more of the Hall elements 301. These distances may be used to define three or more corresponding spheres, where each sphere is centered on a center of the corresponding region. The program 301 can then determine the position of the source of the magnetic field from an intersection of the three or more spheres.

It is noted that the intersection of three spheres may be two different points on opposite sides of the grid pattern 302. However, it is often possible to eliminate one of these two points. For example, if the grid pattern 302 is placed on a floor, the two points may include one above the grid pattern and one below the grid pattern. In such a case, it may be logical to eliminate a point located below the grid pattern and use the point located above the grid pattern as the position of the source of the magnetic field.

A number of variations on the apparatus depicted in FIG. 3 are within the scope of embodiments of the present invention. For example, the grid pattern may be formed on any suitable surface. By way of example, and not by way of limitation, the grid pattern may be formed on a mat made of a flexible material, such as a polymer, rubber, cloth, mesh, or a composite material having layers of polymer, rubber, cloth or mesh.

According to embodiments of the present invention, an apparatus of the type shown in FIG. 3 may be configured to sense motion of a user's feet. A grid pattern may include a plurality of regions made of Hall Effect material that act as Hall Effect sensors. A known electric current may pass through each region. Each region may be selectively coupled to a Hall voltage detector. To sense motion of the user's feet, the user may wear magnets on each foot. The proximity of the user's foot to the mat and the relative position of the foot with respect to the mat can be determined from Hall voltage signals for one or more of the conductive regions. In some embodiments the magnets on different feet may have opposite magnetic polarities. This can make it easier for the system to readily distinguish motion of the user's left and right feet.

Figure 4:
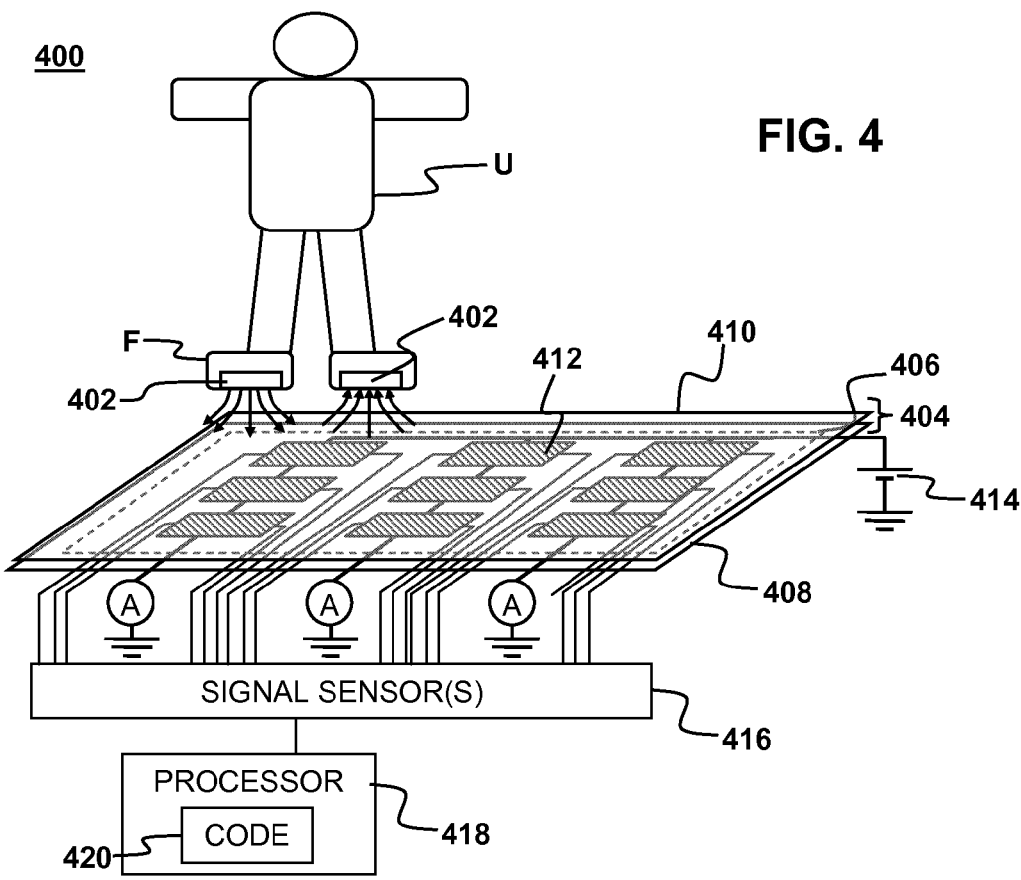
FIG. 4 is a three-dimensional schematic diagram illustrating an example of a Hall Effect input apparatus for a computer apparatus in which magnets are worn on a user's feet.

By way of example, and not by way of limitation, according to an alternative embodiment of the present invention depicted in FIG. 4 a magnetic input apparatus 400 for a computer apparatus (e.g., a computer entertainment device) may include one or more magnets 402 configured to be worn on the fee F of a user U and a mat 404 having a grid pattern 406 of Hall effect material, which may be configured as described above with respect to FIG. 3. In particular, the mat 404 may include a grid pattern 406 sandwiched between first and second electrically insulating layers 408, 410. The grid pattern 406 can include a plurality of regions of Hall-effect material 412. Each region 412 may be of generally rectangular or square in shape a few centimeters on edge.

The Hall-effect regions 412 or other magnetic sensors may be electrically coupled to a current source 414 and to a corresponding signal sensor 416, e.g., in the manner described above with respect to FIG. 3. The signal sensor 416 may include a plurality of sensors with each sensor being coupled to a different Hall-effect region 412 or other magnetic sensor. Each individual Hall-voltage sensor may be configured as described above with respect to FIG. 2. Alternatively, the signal sensor 416 may include a single Hall voltage sensor that is selectively coupled to each different region 412 through a switch.

The signal sensor 416 can respond to changes in the Hall-voltage at each of the Hall-effect regions 412 as a result of the proximity of the magnets 402 worn the user's feet. Alternatively, the signal sensor could respond to changes in magnetoresistance or giant magnetoresistance at regions of material that magnetoresistance or giant magnetoresistance. Signals from the grid pattern 406 resulting from proximity of the magnets 402 can therefore be used as an in put to a processor 418 running suitable code 420 and coupled to the signal sensor 416.

As noted above, magnets 402 worn on different feet may be of opposite polarity so that the processor 418 and code 420 can more easily distinguish between signals due to the magnets on the different feet. If the magnets are of different polarity, the Hall voltage at a given region 412 will be of a different polarity depending on which magnet is closest.

The processor 418 may be coupled to the signal sensor 416, e.g., through an appropriate data acquisition circuit or analog signal processing circuit. The processor 418 can be configured, e.g., through suitable programming of the code 420, to determine a distance between each magnet 402 and one or more of the Hall-effect regions 412 from values of one or more measurements from the signal sensor 416. A value of a given measurement can be calibrated from values of the Hall-voltage signals at a given Hall-effect region 412 when the magnets are at one or more known distances from the given Hall-effect region 412. In general, due to the inverse dependence of the Hall-effect magnetic field strength and the decrease in magnetic field strength with distance, a larger Hall voltage indicates a smaller distance. The processor 418 can be further configured to determine a position of a given magnet 402 relative to the grid pattern 406 from one or more of the distances determined between the magnet 402 and one or more of the Hall-effect regions 412.

By way of example and not by way of limitation, the processor 418 can be configured to determine the position by triangulating the distances determined between the magnet 402 and one or more of the regions 412. Each detected distance between the magnet 402 and a region 412 can define a sphere centered at the center of the region 412. The geometry and arrangement of the regions 412 in the grid pattern 406 can be known and fixed, e.g., if the grid pattern 406 is fixed, e.g. affixed between the insulating layers 408, 410 and more or less restricted to a flat surface. In such a case, distances can be detected from the magnet 402 to three nearby regions 412 can be estimated from signals measured at the regions. These three distances and the centers of the three corresponding regions define spheres, which can intersect and share two common intersection points (assuming the distance measurement is sufficiently accurate). Of the two points one is above the plane of the grid pattern 406, another is below the plane of the grid pattern 406, the point above can be used as triangulated position. In a degenerate case, there may be a single intersection point at the plane of the grid pattern 406. Although, in this example, distance measurements are made using three regions 412, a greater or lesser number of measurements may be made. However, making distance measurements to a greater number of conductive regions can result in better stability of the intersection point determined through triangulation.

In other embodiments the processor 418 can be configured to provide an input to a computer program, such as the code 420, based on values of one or more measurements from the Hall-voltage sensor 416. A value of a given measurement can depend on a capacitive coupling of the signal to a corresponding region 412. In such embodiments, the input can be a location of the magnet 402 relative to the conductive pattern 406. In such embodiments, the program code 420 can be part of a game program.

Figure 5:
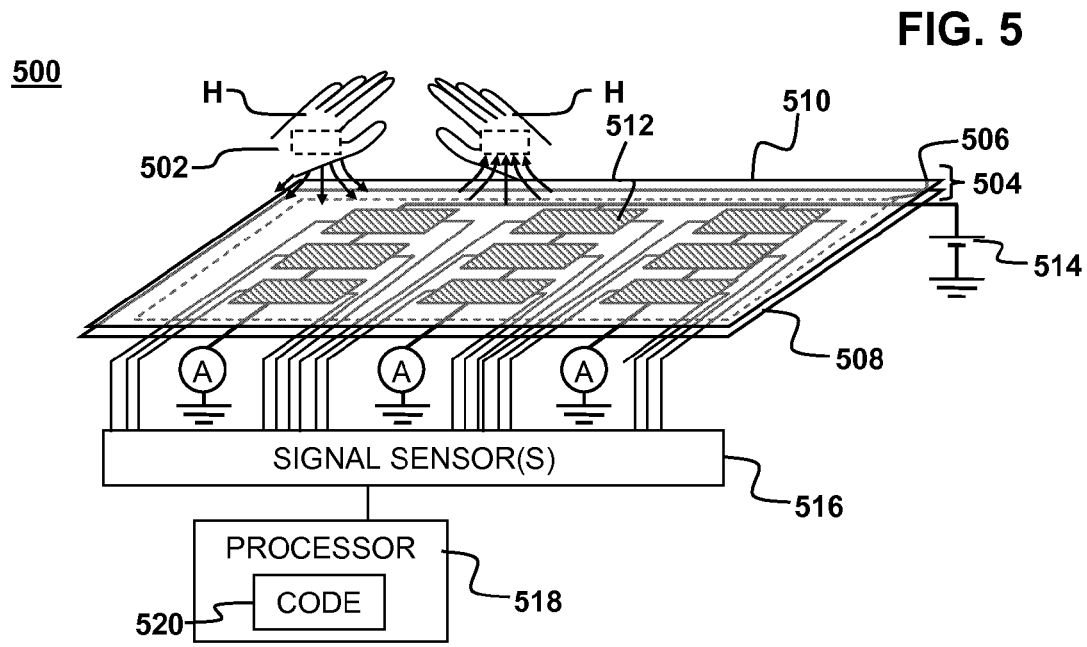
FIG. 5 is a three-dimensional schematic diagram illustrating an example of an alternative Hall Effect input apparatus for a computer apparatus in which magnets are worn on or held by a user's hands.

In another alternative embodiment of the invention shown in FIG. 5, an apparatus 500 may include a mat 504 having grid pattern 506 of Hall-effect regions 512 or other magnetically sensitive regions, as described above with respect to FIG. 4. Specifically, the grid pattern 506 can be coupled to a current source 514 and signal sensor 516 that is configured to measure a Hall voltage at each region 512. The signal sensor 516 may include multiple sensors, with each sensor coupled to a different region 512. Alternatively, the signal sensor 516 may include a single sensor that can be selectively coupled to each individual region through a switch. The signal sensor 516 can be coupled to a processor 518 running suitable software 520. The software can determine the position of one or more magnets 502 that are worn on or held in a user's hands H, e.g., by triangulation. The magnets in each different hand may be of opposite polarity to facilitate distinguishing Hall voltage signals due to the different magnets.

Figure 6:
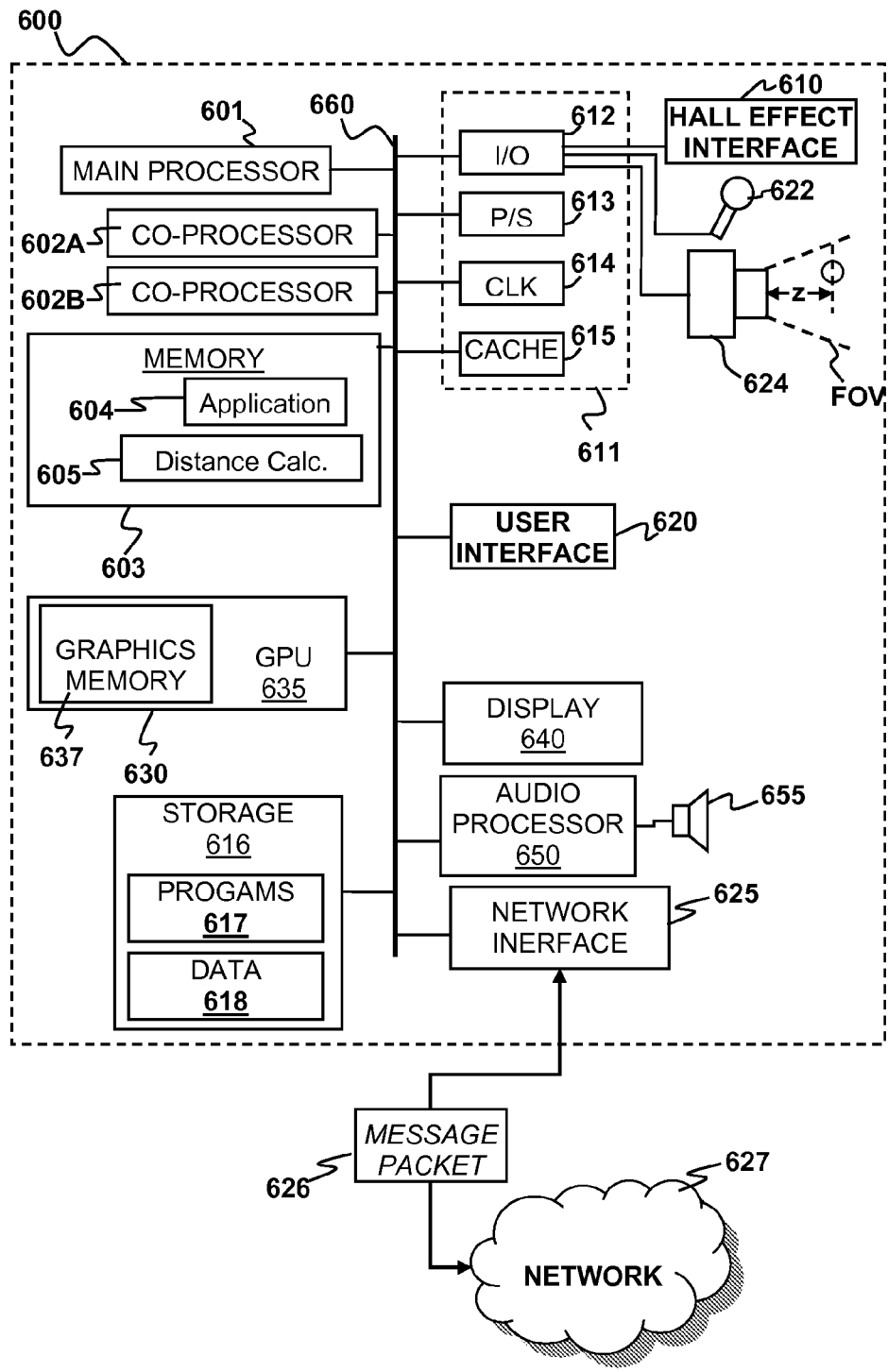
FIG. 6 is a block diagram of a computer system according to an embodiment of the present invention.

A magnetic input apparatus configured in accordance with embodiments of the present invention may be combined with a computer entertainment device in any of a number of ways. By way of example, FIG. 6 is a block diagram illustrating a computer entertainment apparatus 600 utilizing a magnetic input device according to an embodiment of the present invention. By way of example, and without loss of generality, the apparatus 600 may be implemented as part of a computer system, such as a personal computer, video game console, personal digital assistant, cellular telephone, hand-held gaming device, portable internet device or other digital device. In a preferred embodiment, the apparatus is implemented as part of a video game console.

The apparatus 600 generally includes one or more processing units. By way of example, and not by way of limitation, the one or more processing units may include at least one main processing unit 601 and one or more co-processor elements 602A, 602B. Each co-processor element may have a processor unit and an associated local memory. The apparatus can include a memory unit 603 that is separate from the processing unit 601 or co-processor elements 602A, 602B.

The processing unit 601 may include one or more processing cores. By way of example and without limitation, the main processing unit 601 and co-processor elements 602A, 602B may be part of a parallel processor module, such as a Cell Processor. An example of a Cell Processor architecture is described in detail, e.g., in *Cell Broadband Engine Architecture*, copyright International Business Machines Corporation, Sony Computer Entertainment Incorporated, Toshiba Corporation Aug. 8, 2005 a copy of which may be downloaded at http://cell.scei.co.jp/, the entire contents of which are incorporated herein by reference.

In a Cell Processor architecture, the computational unit corresponding to the processing unit 601 is referred to as a "Power Processing Element" (PPE) and the computational units corresponding to the co-processor elements 602A, 602B are referred to as "Synergistic Processing Elements" (SPE). It is noted that a Cell Processor architecture is but one example, among others, of a suitable processor architecture that may be used with embodiments of the invention. However, embodiments of the present invention may be implemented using other multi-processor architectures.

The memory unit 603 may be any suitable medium for storing information in computer readable form. By way of example, and not by way of limitation, the memory unit 603 may include random access memory (RAM) or read only memory (ROM), a computer readable storage disk for a fixed disk drive (e.g., a hard disk drive), or a removable disk drive.

The apparatus 600 may also include well-known support functions 611, such as input/output (I/O) elements 612, power supplies (P/S) 613, a clock (CLK) 614 and cache 615. The apparatus 600 may further include a storage device 616 that provides non-volatile storage for software program instructions 617 and data 618. By way of example, the storage device 616 may be a fixed disk drive, removable disk drive, flash memory device, tape drive, CD-ROM, DVD-ROM, Blu-ray, HD-DVD, UMD, or other optical storage devices.

A magnetic interface 610 can be coupled to the processing unit 601, e.g., via the I/O elements 612. In general, the interface 610 may include one or more magnets configured to be worn on a user's feet or hands and grid pattern of magnetic sensors, such as Hall-effect material regions. Each region can be selectively coupled to a corresponding Hall voltage sensor. By way of example, and not by way of limitation, the magnetic interface 610 may be configured as described above with respect to FIG. 3, FIG. 4, or FIG. 5. As noted above, the magnetic sensors in the magnetic interface 610 may be alternatively be implemented as an array of magnetoresistive sensors (MR), giant magnetoresistance (GMR) sensors, and the like. Commercially available examples of such magnetic sensors include HMC series sensors from Honeywell Aerospace Plymouth of Plymouth, Minn.

The main processing unit 601 and co-processors 602A, 602B may be configured to run software applications and optionally an operating system. Portions of such software applications may be stored in the memory unit 603. Instructions and data may be loaded into registers of the main processing unit 601 or local stores of the co-processor elements 602A, 602B for execution. The software applications may include a main application 603, such as a video game application. The main application 604 may operate in conjunction with a distance calculation routine 605. In particular, the distance calculation routine 605 can determine a distance between one or more magnets and one or more magnetic sensors (e.g. Hall-effect material regions, MR sensors, or GMR sensors) in a grid pattern from values of one or more measurements (e.g., from a Hall-voltage sensor), which may be part of the interface 610.

The distance calculation routine 605 may trigger the application 604 to change a state of the apparatus 600 when one or more magnets are determined to be in a particular location. As used herein, a "change of state" refers to a change in the operation of the apparatus. By way of example, a change of state may include execution of a command or selection of particular data for use by another process handled by the application 604. A non-limiting example of execution of a command would be for the apparatus to begin the process of comparing a calculated position of a magnet to a predetermined position for the magnet at a particular time. A score may be determined based on the proximity of the calculated position to the predetermined position. A sequence of predetermined positions may be established with respect to a particular time reference, such as a time reference within a piece of music that is playing in conjunction with the program 604. Magnets may be placed on the user's feet and/or hands. By sequentially comparing the calculated position the predetermined positions at the relevant times, the apparatus 600 may continuously track the position of the user's feet and/or hands as the user dances on the mat. The program can score the user based on how closely the user follows a predetermined sequence of dance steps selected for a given piece of music.

The apparatus 600 may include a network interface 625 to facilitate communication via an electronic communications network 627. The network interface 625 may be configured to implement wired or wireless communication over local area networks and wide area networks such as the Internet. The system 600 may send and receive data and/or requests for files via one or more message packets 626 over the network 627.

The apparatus 600 may further comprise a graphics subsystem 630, which may include a graphics processing unit (GPU) 635 and graphics memory 637. The graphics memory 637 may include a display memory (e.g., a frame buffer) used for storing pixel data for each pixel of an output image. The graphics memory 637 may be integrated in the same device as the GPU 635, connected as a separate device with GPU 635, and/or implemented within the memory unit 603. Pixel data may be provided to the graphics memory 637 directly from the processing unit 601 and/or or co-processors 602A, 602B. In some embodiments, the graphics unit may receive a video signal data extracted from a digital broadcast signal decoded by a decoder (not shown). Alternatively, the processing unit 601 may provide the GPU 635 with data and/or instructions defining the desired output images, from which the GPU 635 may generate the pixel data of one or more output images. The data and/or instructions defining the desired output images may be stored in memory 602 and/or graphics memory 637. In an embodiment, the GPU 635 may be configured (e.g., by suitable programming or hardware configuration) with 3D rendering capabilities for generating pixel data for output images from instructions and data defining the geometry, lighting, shading, texturing, motion, and/or camera parameters for a scene. The GPU 635 may further include one or more programmable execution units capable of executing shader programs.

The graphics subsystem 630 may periodically output pixel data for an image from the graphics memory 637 to be displayed on a video display device 640. The video display device 650 may be any device capable of displaying visual information in response to a signal from the apparatus 600, including CRT, LCD, plasma, and OLED displays that can display text, numerals, graphical symbols, or images. The digital broadcast receiving device 600 may provide the display device 640 with a display-driving signal in analog or digital form, depending on the type of display device. In addition, the display 640 may be complemented by one or more audio speakers that produce audible or otherwise detectable sounds. To facilitate generation of such sounds, the apparatus 600 may further include an audio processor 650 adapted to generate analog or digital audio output from instructions and/or data provided by the processing unit 601, memory unit 602, and/or storage 616. The audio output may be converted to audible sounds, e.g., by a speaker 655.

The components of the apparatus 600, including the main processing unit 601, co-processor elements 602A, 602B, Hall-effect interface 610, support functions 611, data storage 616, conventional user input devices 620 such as a game controller, keyboard, or mouse, network interface 625, graphics subsystem 630 and audio processor 650 may be operably connected to each other via one or more data buses 660. These components may be implemented in hardware, software, firmware, or some combination of two or more of these.

By way of example, and not by way of limitation, the apparatus 600 may optionally include a microphone 622 and a camera 624, which may be a depth camera, sometimes also known as a 3D camera or zed camera. The microphone 622 and camera 624 may be coupled to the data bus via the I/O functions. The main application 604 may analyze images obtained with the camera to determine information relating to the location of persons or objects within a field of view FOV of the camera 624. The location information can include a depth z of such persons or objects. The main application 604 may use the location information in conjunction with information from the capacitive interface as described above to obtain information regarding the location of the user and information regarding the orientation of the user's body. This information may be used to provide additional inputs to the application 604.

Embodiments of the invention allow for a greater degree of resolution in tracking the position of the user's feet than is possible with a conventional prior art dance mat. In addition, embodiments of the present invention allow for tracking of the user's hands and/or other parts of the user's body on which magnets are placed.

In addition, embodiments of the invention also allow first and second order differentiation with respect to time of the relative position of the feet and/or hands. Such differentiation can be used to determine the velocity and acceleration of the feet and/or hands. For articulated open-chain bodies, such velocity and acceleration information is useful to help further estimate full body motion beyond feet by means of inversed kinematics or trajectory planning.

Furthermore, embodiments of the present invention may be useful in applications beyond gaming. For example, in a robot technology application, magnets may be incorporated into a robot and an entire room or other area may be covered by a Hall-effect material grid pattern. The robot can use the capacitive position determination technique described above to move about the room based on artificial intelligence.

The reader's attention is directed to all papers and documents which are filed concurrently with this specification and which are open to public inspection with this specification, and the contents of all such papers and documents incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

While the above is a complete description of the preferred embodiment of the present invention, it is possible to use various alternatives, modifications, and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A magnetic input apparatus for a computer device, comprising:
    a grid pattern of Hall Effect material, wherein the grid pattern includes a plurality of Hall elements, wherein each Hall element is selectively coupled to a Hall voltage sensor; and
    two or more magnets of sufficient strength to change a Hall voltage signal measured at one of the Hall elements by the corresponding Hall voltage sensor, wherein a degree of the change of the signal varies with a degree of proximity of the magnet to the corresponding one of the Hall elements,
    wherein the two or more magnets are configured to be worn on a user's hands or feet,
    wherein the two or more magnets include a first magnet configured to be worn on a first hand or foot and a second magnet configured to be worn on a second hand or foot, wherein the first and second magnets are configured to provide magnetic fields that are oppositely oriented with respect to each other.

2. The apparatus of claim 1, wherein the Hall voltage sensor includes a differential amplifier and a switch configured to selectively couple each region to the differential amplifier.

3. The apparatus of claim 2, further comprising an analog signal processing chip having an input coupled to an output of the differential amplifier.

4. The apparatus of claim 1, further comprising a current source configured to supply a known electric current through each Hall element.

5. The apparatus of claim 1, further comprising a mat made of a flexible material, wherein the grid pattern is formed on the mat.

6. The apparatus of claim 1, wherein the computer device is a computer entertainment device.

7. The method of claim 1, wherein the two or more magnets include a magnet configured to be worn on a user's hand.

8. The apparatus of claim 1, further comprising a computer processor coupled to the Hall voltage sensor, wherein the computer processor is configured to obtain Hall voltage measurements from the Hall voltage sensor from one or more of the Hall elements and analyze the measurements to determine a position of a source of a magnetic field with respect to the grid pattern.

9. The apparatus of claim 8 wherein the computer processor is configured to determine a distance to the source of the magnetic field from one or more of the Hall elements.

10. The apparatus of claim 8 wherein the computer processor is configured to determine a distance to the source of the magnetic field from three or more of the Hall elements, define three or more corresponding spheres, wherein each sphere is centered on a center of the corresponding Hall element, and determine the position of the source of the magnetic field from an intersection of the three or more spheres.

11. A method for receiving an input to a computer program for a computer device having a magnetic input apparatus coupled to a processor, wherein the magnetic input device includes a grid pattern of Hall elements, wherein the grid pattern includes a plurality of Hall elements, wherein each Hall element is selectively coupled to a Hall voltage sensor, the method comprising:
    positioning a source of magnetic field in proximity to the grid pattern;
    collecting one or more Hall voltage measurements for one or more of the regions with the Hall voltage sensor;
    analyzing the measurements to determine a position of a source of a magnetic field with respect to the grid pattern; and
    providing the input to the computer program based on the determined position of the source of the magnetic field,
    wherein the source of the magnetic field includes first and second magnets configured to be worn on first and second hands or feet of a user, respectively,
    wherein the first and second magnets are configured to provide magnetic fields that are oppositely oriented with respect to each other and wherein determining the position of the source of the magnetic field includes determining a first position for the first magnet and determining a second position for the second magnet.

12. The method of claim 11, wherein determining the position of the source of the magnetic field includes determining one or more distances to the source of the magnetic field from each of the one or more of the Hall elements.

13. The method of claim 11, wherein determining the position of the source of the magnetic field includes determining a distance to the source of the magnetic field from three or more of the Hall elements, defining three or more corresponding spheres, wherein each sphere is centered on a center of the corresponding Hall element, and determining the position of the source of the magnetic field from an intersection of the three or more spheres.

14. The method of claim 11 wherein the first and second magnets include a magnet worn on a user's foot.

15. The method of claim 11 wherein the first and second magnets include a magnet worn on a user's hand.

16. A magnetic input apparatus for a computer device, comprising:
 a grid pattern of magnetic sensors, wherein the grid pattern includes a plurality of magnetic sensor elements;
 a mat made of a flexible material, wherein the grid pattern is formed on the mat;
 two or more magnets configured to be worn on a user's feet or hands; and
 a computer processor coupled to the plurality of magnetic sensors, wherein the computer processor is configured to obtain measurements from one or more of the magnetic sensors and analyze the measurements to determine a position of a source of a magnetic field with respect to the grid pattern,
wherein the two or more magnets are configured to be worn on a user's hands or feet,
wherein the two or more magnets include a first magnet configured to be worn on a first hand or foot and a second magnet configured to be worn on a second hand or foot, wherein the first and second magnets are configured to provide magnetic fields that are oppositely oriented with respect to each other.

* * * * *